United States Patent [19]

Overton, Jr. et al.

[11] 4,437,064

[45] Mar. 13, 1984

[54] APPARATUS FOR DETECTING A MAGNETIC ANOMALY CONTIGUOUS TO REMOTE LOCATION BY SQUID GRADIOMETER AND MAGNETOMETER SYSTEMS

[75] Inventors: William C. Overton, Jr.; William A. Steyert, Jr., both of Los Alamos, N. Mex.

[73] Assignee: The United States of America as represented by the United States Department of Energy, Washington, D.C.

[21] Appl. No.: 266,247

[22] Filed: May 22, 1981

[51] Int. Cl.³ .................. G01V 3/26; G01R 33/035
[52] U.S. Cl. .................................. 324/346; 324/248
[58] Field of Search .................. 324/248, 345, 346

[56] References Cited

U.S. PATENT DOCUMENTS

| 3,317,821 | 5/1967 | Patton et al. | 324/346 |
| 3,745,446 | 7/1973 | Norris | 324/346 |
| 3,965,413 | 6/1976 | Yungul | 324/346 |
| 4,349,781 | 9/1982 | Vozoff | 324/346 |

FOREIGN PATENT DOCUMENTS 648774  9/1962  Canada .............................. 324/346

OTHER PUBLICATIONS

Steyert et al., "Squid System Cryogenic Environment for Deep Borehole Logging", Squid Application to Geophysics, 93, Soc. of Exploration Geophysicists, May 1981.

Overton, Jr., W. C., "Detection of a Thin Sheet Magnetic Anomaly by Squid Gradiometer Systems . . . ", Squid Applications to Geophysics, 172, Soc. of Expl. Geophysicists, May 1981.

Primary Examiner—Gerard R. Strecker
Attorney, Agent, or Firm—Leonard C. Brenner; Paul D. Gaetjens; Richard G. Besha

[57] ABSTRACT

A superconducting quantum interference device (SQUID) magnetic detection apparatus detects magnetic fields, signals, and anomalies at remote locations. Two remotely rotatable SQUID gradiometers may be housed in a cryogenic environment to search for and locate unambiguously magnetic anomalies. The SQUID magnetic detection apparatus can be used to determine the azimuth of a hydrofracture by first flooding the hydrofracture with a ferrofluid to create an artificial magnetic anomaly therein.

11 Claims, 4 Drawing Figures

APPARATUS FOR DETECTING A MAGNETIC ANOMALY CONTIGUOUS TO REMOTE LOCATION BY SQUID GRADIOMETER AND MAGNETOMETER SYSTEMS

This invention is a result of a contract with the Department of Energy (Contract No. W-7405-ENG-36).

CROSS REFERENCE TO RELATED APPLICATION

The present invention uses magnetometers and gradiometers of the superconducting quantum interference device (SQUID) type operating in a super cooled environment at a remote location. Although not limited thereto, such an environment can be achieved as taught in U.S. Pat. application Ser. No. 202,041, now U.S. Pat. No. 4,340,405, filed by the inventors of the present invention on Oct. 29, 1980, entitled "An Appartus and Method for Maintaining Low Temperatures About an Object at a Remote Location" and assigned to the Government of the United States as represented by the United States Department of Energy, and/or its assigns as is the present invention.

BACKGROUND OF THE INVENTION

This invention relates to structures and methods for detecting magnetic anomalies at remote locations and more particularly to an apparatus and method for using magnetometers and gradiometers of the superconducting quantum interference device (SQUID) type to detect a magnetic anomaly artificially created or otherwise near a borehole or the like.

It is desirable to magnetically log boreholes in order to determine the physical properties of rocks such as porosity and flow permeability. With sensitive magnetometers and gradiometers located in a deep borehole, on the order of two miles in depth, one can measure at significant distances magnetic fluctuations produced by below-ground and above-ground nuclear detonations.

At a great depth below the earth's surface, surface magnetic fluctuations and noise created by lightning, power generation, and other disturbances are greatly diminished thereby permitting the use of extremely sensitive magnetic detecting devices. The most sensitive of such devices known to the inventors are SQUIDs which require a safe, quiet cryogenic environment such as provided by the teachings of the above-cited U.S. patent application Ser. No. 202,041, now U.S. Pat. No. 4,340,405.

An important application of the present invention occurs in the development of hot dry rock (HDR) geothermal energy. To generate HDR geothermal energy, a deep (greater than 2,500 meters) borehole is drilled into an HDR zone and flooded under high pressure to create splits, cracks, or fissures caused by hydrofracturing. A second borehole is then drilled about two hundred (200) meters from the first so as to intersect the fracture zones. To generate geothermal power water is pumped down one borehole to flow through the cracks to the second borehole becoming heated by the HDR in the process and emerging as steam to run an electric power plant.

Because of the very great expense of deep borehole drilling, significant economies result if the azimuth of the hydrofracture crack system is known accurately without ambiguity prior to the drilling of the second borehole.

SUMMARY OF THE INVENTION

One object of the present invention is to provide a SQUID gradiometer and magnetometer system operating as a logging instrument at a remote location for an extended period of time.

Another object of the present invention is to provide a SQUID system capable of determining magnetic anomaly azimuth unambiguously at a remote location.

Still a further object of the present invention is to provide a method of using a SQUID system operating within a deep borehole for determining the azimuth of a hydrofracture extending therefrom.

In accordance with the present invention there is provided a safe quiet cryogenic environment suitable for insertion into a deep borehole, the cryogenic environment housing a SQUID system for detecting magnetic anomalies proximate to the borehole. Preferably, a gyroscope and a SQUID system positioner such as a motor system is provided to either aim the SQUID system at a particular azimuth or to sweep the SQUID system in search of anomalies as desired. Also preferably the SQUID system includes an axially mounted SQUID and a planar mounted SQUID both SQUIDs thereof being capable of functioning in the gradiometer mode so as to eliminate azimuth ambiguities that arise when only a single SQUID is used.

Further in accord with the present invention the azimuth of a hydrofracture fracture crack extending from the borehole can be determined by first flooding the borehole and thereby the hydrofracture crack with a ferrofluid to create an artificial magnetic anomaly for detection by the above-described SQUID system.

One advantage of the present invention is that a most sensitive magnetic detection system is provided operable at a remote location such as in a deep borehole to locate magnetic anomalies thereat.

Another advantage of the present invention is that a method is provided for determining the azimuth of a hydrofracture crack extending from a borehole.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF A PREFERRED EMBODIMENT OF THE INVENTION

Figure 1:
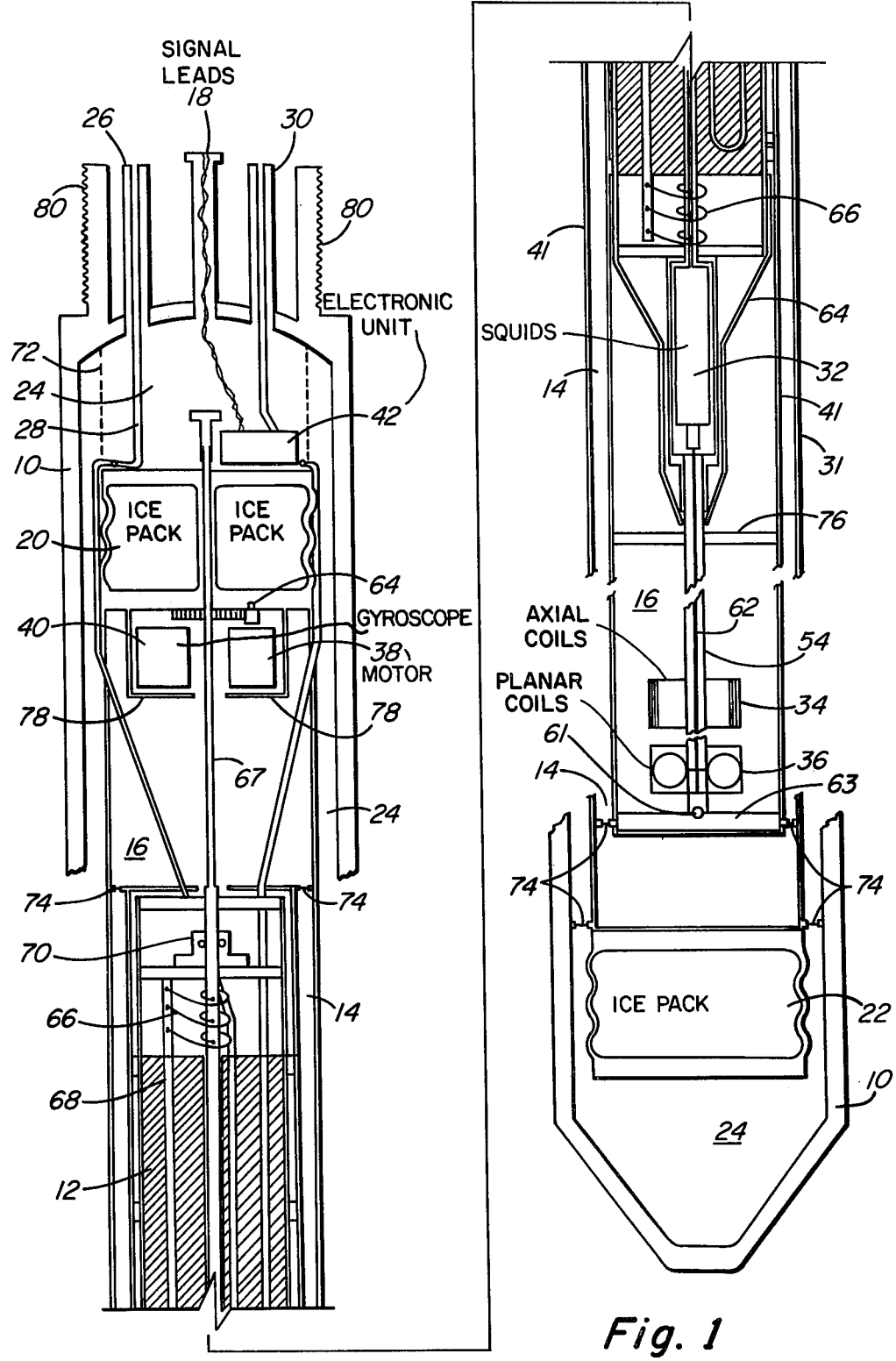
FIG. 1 is a cross sectional view of a preferred embodiment of the invention.

Reference is now made to FIG. 1 which shows a preferred embodiment of an apparatus in accordance with the present invention. Preferably the apparatus secures a pair of superconducting quantum interference device (SQUID) units 32 in a safe stable cryogenic environment suitable for insertion into a deep borehole. Since the preferred method and apparatus for creating such a cryogenic environment are taught in detail in the above-referenced U.S. patent application Ser. No. 202,041, now U.S. Pat. No. 4,340,405, the same will be only briefly described herein for the purposes of completeness and to develop a fuller appreciation and understanding of the present invention.

The apparatus comprises a housing 10 which surrounds a body 12 comprising, for example, monoclinic $Gd_2O_3$, although other materials may be used. Between body 12 and housing 10 is preferably disposed in a vacuum a layer of superinsulation 14, such as carbon-loaded getter-paper alternated with aluminized plastic superinsulation. Alternatively, a gas getter such as activated charcoal powder can be used instead of the getter-paper. Since each SQUID unit 32 is used as a magnetometer or gradiometer, it is desirable that all of the components of the housing 10 and superinsulation 14 be nonmagnetic. In situations where it is not necessary for high frequency electromagnetic signals to enter or leave the tool, beryllium copper is a suitable material for the housing 10.

Logging instrumentation is enclosed in body 12 within a cavity or orifice having wall 16. The logging instrumentation comprises the pair of SQUID units 32, a pair of axially mounted gradiometer coils 34, a pair of planar mounted gradiometer coils 36, a motor 38, preferably a small fractional hp reversible motor, for rotating and positioning the coils 34 and 36, a gyroscope 40 for providing a fixed positional reference and an electronic unit 42 for standard buffering of control and information signals between the logging instrumentation and the surface through signal leads 18.

The logging instrumentation may be contained in a slitted metal radiation shield 41 which is then disposed with the orifice. A thermally conductive cylinder 31 serves to connect the two ice packs 20 and 22. An additional layer of aluminized superinsulation 24 or other thermal isolator is preferably provided between the housing 10 and the superinsulation 14 to protect body 12 from heat external to housing 10. Cylinder 31 protects the instrumentation from high temperatures of the borehole and serves to carry the cooling effect of the venting gas to freeze the lower ice pack 22 during precooling at the surface. A cryogenic environment is obtained by flowing helium through vacuum insulated liquid helium cooling tube 26. The liquid helium passes through a conduit 28 preferably comprising thin walled stainless steel tubing in order to cool body 12 down to a cryogenic temperature. A vent 30 allows liquid helium which has passed through the body 12 out of the housing 10.

Within the cryogenic environment preferably created as above-described the pair of SQUID units 32 functions individually and in conjunction with the pair of horizontal axially mounted coils 34 and the pair of planar mounted coils 36. Although SQUIDs have been developed and improved over the past decade as extremely accurate and sensitive devices particularly as medical diagnostic tools such as in the magnetocardiogram and magnetoencephalogram and as other detectors in numerous physics applications, considerable attention must be paid to the construction of the coils 34 and 36 to achieve high precision magnetometer and gradiometer measurements especially when such coils are confined to fit within a borehole as is the preferred mode of operation contemplated for the present invention.

Figure 2:
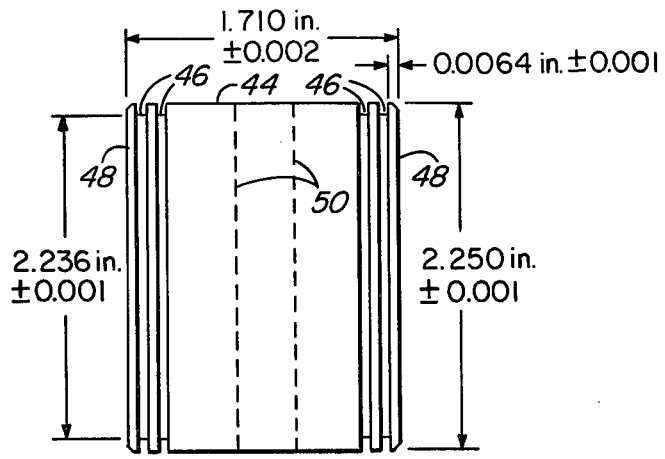
FIG. 2 is a side view diagram of a pair of horizontal axially mounted SQUID gradiometer coils used in the embodiment of FIG. 1.

With reference now to FIG. 2 which illustrates a suitable construction of the axial coil form 44 for the pair of horizontal axial gradiometer coils 34. The axial coil form 44 is machined and polished carefully from a high thermal conductive insulator preferably sapphire. The axial coil form 44 has a diameter and length in the preferred embodiment thereof of $2.25 \pm 0.001$ inches and $1.710 \pm 0.002$ inches, respectively. Around the circumference of the cylinder of the coil form 44 are four carefully machined grooves 46 such that the diameter of the grooves are $2.236 \pm 0.001$ inches and all grooves 46 are within 0.0002 inches of each other. Each groove 46 has a width of $0.0064 \pm 0.001$ inches. The grooves 46 are centered symmetrically on the coil form 44 so that one groove is machined $0.035$ inches $\pm 0.0005$ inches and other $0.065$ inches $\pm 0.0005$ inches fron each end 48 of the coil form 44. The coil form 44 as constructed is fashioned to be wound within the grooves 46 with a pair of coils, each coil thereof being two turns of 0.006 inches diameter niobium (Nb) wire thus having an inductance on the order of two (2) microhenrys.

The need for such careful attention to the coil form 44 arises from the very high sensitivity of each SQUID unit 32 and the severe size limitations placed upon the coil form 44 in order to have it insertable within a reasonable borehole. Without the size limitations of the borehole, it is conceivable that the diameter and separation of the grooves 46 and wire therein would be much greater and tolerances would thereby be decreased. In a gradiometer mode of operation, the SQUID employs the coils wrapped in the grooves 46 in opposing fashion and the necessity to have the pair of axial gradiometer coils 34 thus formed to be nearly perfectly balanced derives from the desire to utilize the full sensitivity and resolution achievable by each SQUID unit 32. Fortunately, such tight tolerances on the coil form 44 can be manufactured to specification by state of the art technology as utilized at and by companies such as the S.H.E. Corporation of San Diego, Calif. and the Canadian firm C.T.F. Systems, Inc. As also can be viewed in FIG. 2 there is a cylindrical hole through coil form 44 having wall 50 thereof. The hole with wall 50 permits a sapphire rod to be extended through the coil form 44 for rotation thereof.

Figure 3:
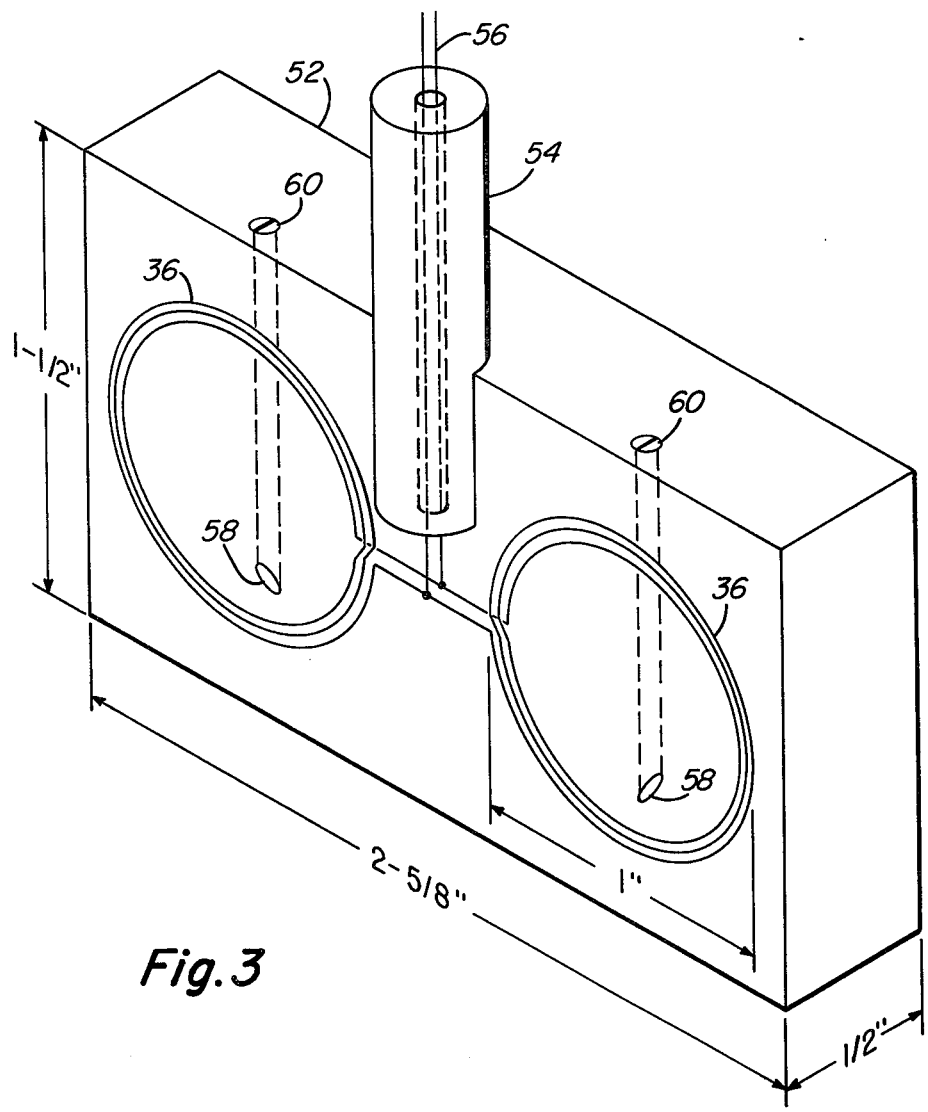
FIG. 3 is a front view of a pair of planar mounted SQUID gradiometer coils used in the embodiment of FIG. 1.

With reference now to FIG. 3, there is shown a suitable method for fabricating the pair of planar gradiometer coils 36 by depositing same symmetrically upon a substrate of sapphire 52. Preferably, the sapphire substrate 52 is ground flat to a wavelength of green light and has dimensions as shown roughly $2\frac{3}{8}$ inches wide by 1.5 inches high and 0.5 inches thick. The pair of planar gradient coils 36 are comprised of two spiral coils of NbTi alloy evaporated on the substrate 52 in a highly symmetrical fashion so that the coils in the pair are essentially equal to one part in ten thousand. A hollow sapphire rod 54 is secured to the substrate 52 so that leads 56 may be connected to the pair of coils 36 and fed to a SQUID unit 32. The pair of three turn coils 36 thus fabricated are approximately 1 inch in diameter and have an inductance of about 1 microhenry. To even better secure symmetry of the pair of coils 36, superconducting trim tabs 58 may be inserted near the pair of coils 36 and adjusted by screw slots 60. In this technique the superconducting trim tabs 58 are rotated so that more or less of their mass influences the pair of coils 36 to achieve essentially perfect balance between the pair of coils. Although in FIG. 3 only two such superconducting trim tabs 58 are shown for reasons of clarity, it would be common and preferable to have as many as six superconducting trim tabs 58. The superconducting trim tabs 58 allow for extremely fine tuning and balancing of the pair of coils 36. It should be noted that although not shown in FIG. 2, the technique of using superconducting trim tabs 58 to secure near perfect balance between a pair of superconducting coils could and preferably would also be employed. The sapphire rod 54 provides not only a path for the leads 56 but being only $\frac{3}{8}$ inch in diameter and constructed of sapphire it also provides good heat conduction to and from the substrate 52, in order to maintain same at a temperature below 100 degrees Kelvin.

With reference again to FIG. 1, it can be seen that the pair of planar coils 36 shown in FIG. 3 and the pair of horizontal axial coils 34 mounted on form 44 shown in FIG. 2 are coupled to the pair of SQUID units 32 through the hollow sapphire rod 54. Although not detailed in FIG. 3, it can be seen in FIG. 1 that preferably the rod 54 extends downwardly to be rotatably secured by sapphire ball bearing 61 and sapphire ball bearing assembly 63. Preferably, a thin wall tube 62 or a plurality thereof are inserted in the hollow rod 54 to provide a cavity for an electrical coupling between the pair of SQUID units 32 and the pair of horizontal axial coils 34 and planar coils 36. The pair of SQUID units 32 is housed within an Nb magnetic shield 64. A pair of flex bundle arrays 66 in combination with a heat exchange rod 68 provides coupling between the pair of SQUID units 32 and the electronic unit 42. The drive motor 38 is coupled through gearing 64 and a thin wall tube 67 to the pair of SQUID units 32. Preferably the thin walled tube 67 is rotatably secured by dry sapphire bearings 70.

The drive motor 38 can now rotate the axial coils 34 and the planar coils 36 to any desired angle with respect to information from the gyroscope 40 as directed by the electronic unit 42 which communicates with the surface through electrical leads 18. The flex wire bundle arrays 66 provide rotation of the coils 34 and 36 to over 360°. Thus the coils 34 and 36 may be swept through an entire 360° arc for gradiometer or magnetometer mapping purposes or they may be aimed at any particular direction and positioned there indefinitely. Wire longitudinal supports 72, lateral wire supports 74 in the form of a harness having long thermal paths and nonmagnetic spacers 76 are preferably added for increased mechanical support stability and heat isolation. The wire supports 74 and 76 provide structural strength with heat isolation and may be fashioned from long slender wires having poor thermal conductivity at low temperatures, preferably tungsten. Further, Nb magnetic shielding 78 is provided around the gyroscope 40 and the drive motor 38 to prevent adverse magnetic influence upon the SQUID 32 with its coils 34 and 36. The housing 10 has a threated top mounted portion 80 as is conventional for logging tools.

Figure 4:
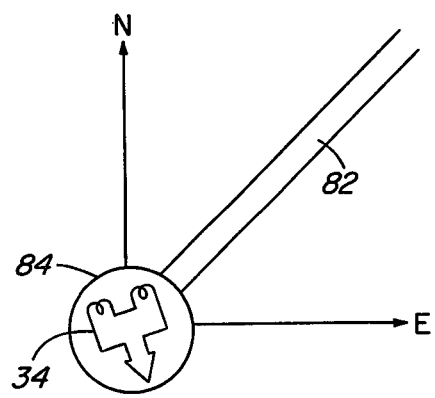
FIG. 4 is a diagram illustrating the invention functioning to azimuthally locate a hydrofracture contiguous to a borehole.

With reference to FIG. 4, it may be seen that a significant application of the present invention is the detection of a hydrofracture crack 82 having a thickness on the order of one millimeter. For purposes of illustration, the thickness of the hydrofracture crack 82 as shown in FIG. 4 is greatly exaggerated. The apparatus of the invention as illustrated solely by the pair of horizontal axially mounted coils 34 is inserted in a borehole having a borehole wall 84. The hydrofracture 82 is created as described above by applying under high pressure fluid down the borehole having borehole wall 84. The hydrofracture 82 is then created in the earth which is composed of hot dry rock (HDR) if the purpose herein is to create geothermal energy. Once the hydrofracture 82 has been created, the problem comes to locate it so that a second borehole may be made with a high probability of intersecting it. To create a magnetic anomaly for detection by the SQUID units 32, the hydrofracture crack 82 is flooded with a magnetic ferrofluid. Such magnetic ferrofluid may be manufactured by a process described in U.S. Pat. No. 3,843,540 for ferrofluid mass production filed by Reimers et al. Two parts of ferric chloride are mixed with one part of ferrous chloride in water solution. When reduced by ammonium hydroxide, the process precipitates colloidal sized magnetite particles. After washing and decanting off the solution, high quality kerosene such as Jet A fuel is added and the particles stirred into temporary suspension. Peptizing with oleic acid coats and separates the particles so that the magnetic forces tending to agglomerate the particles can be overcome by Brownian motion. The magnetic permeability of such ferrofluid has a $k_m$ varying from 1.15 to 1.7 which appears to be optimum for the present application. By forcing the ferrofluid thus manufactured down the borehole to the hydrofracture crack 82 a magnetic anomaly is created within the hydrofracture crack 82 which is quite readily detected by the extremely high sensitive SQUID 32 detector and coils 34. In situations where a less sensitive detector is utilized or unavoidable imbalances occur within the coils 34 and 36 leading to inaccuracies, an alternate procedure can be used whereby the SQUID unit 32 is inserted in the borehole before the ferrofluid is forced into the hydrofracture crack 82 and a run or mapping of the normal magnetic field around the borehole is obtained to be compared later with the magnetic field measured after the ferrofluid is forced into the hydrofracture crack 82. The disturbance of the magnetic field by the ferrofluid within the hydrocrack 82 is then greatly magnified by reason of having such a baseline reading.

It should be appreciated that the above description details a preferred embodiment of the invention as presently considered by the inventors. Other modifications and additions to the above embodiment may be made without departing from the scope thereof. For example, additional gradiometer or magnetometer coils may be added to the SQUID in varying rotational axes to better and even more unambiguously define and locate hydrofracture cracks and other magnetic anomalies. Also, obviously, the gyroscope 40 may be deleted as desired, particularly if rotational reference can be determined by observation or other means. Further, particular design and construction details may be varied as required or desired. For example, the horizontal axial coils 34 may be wound upon a square form rather than a round cylinder is described. Other like variations may be made upon other components as particular applications may necessitate. Finally, it is understood that the terms "vertical" and "horizontal" merely refer to orientation when the present invention is used in a "vertical" borehole and do not limit the use of the present invention to such a borehole or orientation.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A SQUID magnetic detection apparatus suitable for operation at a remote location such as within a borehole, said apparatus comprising:

cryogenic housing means insertable into a borehole for containing and maintaining a cryogenic environment within:

first SQUID means secured within said cryogenic housing means, said first SQUID means having a horizontal axial position axially rotatable magnetic field sensing coil arrangement including a pair of balanced axial coils wherein each coil in said pair of balanced axial coils is wound near an individually associated end of a high thermal conductive insulating round cylinder of approximately 2.25 inches in diameter and 1.710 inches in length, said first SQUID means for generating electrical signals representative of the magnetic field sensed by said horizontal axial position axially rotatable magnetic field sensing coil arrangement;

second SQUID means secured within said cryogenic housing means, said second SQUID means having a horizontal planar position axially rotatable magnetic field sensing coil arrangement including a pair of balanced planar coils wherein each coil in said pair of balanced planar coils comprises an approximately three turn spiral coil of approximately 1 inch outside diameter, formed upon a high thermal conductive insulating form of dimensions approximately 2⅜ inches wide by 1.5 inches high by 0.5 inches thick, said second SQUID means for generating electrical signals representative of the magnetic field sensed by said horizontal planar position axially rotatable magnetic field sensing coil arrangement;

rotation means secured with said cryogenic housing means and coupled to said horizongal axial position and said horizontal planar position axially rotatable magnetic field sensing coil arrangements for rotating simultaneously both said coil arrangements;

electronic means secured within said cryogenic housing means, said electronic means communicating with said rotation means for directing the rotating of said rotation means, said electronic means further communicating with said first and second SQUID means for receiving said electrical signals generated by said first and second SQUID means; and remote electrical coupling means connected through said cryogenic housing means to said electronic means for facilitating remote control of said rotation means and remote monitoring of said electrical signals generated by said first and second SQUID means.

2. The invention according to claim 1 wherein said high thermal conductive insulating round cylinder is a sapphire round cylinder.

3. The invention according to claim 1 wherein each coil in said pair of balanced axial coils is formed from approximately 2 turns of substantially 0.006 inch diameter Nb wire.

4. The invention according to claim 1 wherein said pair of balanced coils is a pair of opposingly wound balanced coils for operation in a gradiometer mode.

5. The invention according to claim 1 wherein said pair of balanced planar coils is formed by evaporation of a superconductive alloy upon said high thermal conductive insulating form.

6. The invention according to claim 1 wherein said pair of balanced planar coils is a pair of opposingly spirally balanced coils for operation in a gradiometer mode.

7. The invention according to claim 5 wherein said high thermal conductive insulating form is a sapphire form.

8. The invention according to claim 7 wherein said superconductive alloy is a NbTi alloy.

9. The invention according to claim 1 wherein said rotation means is operable for rotating said horizontal axial position and said horizontal planar position axially rotatable magnetic field sensing coil arrangements through approximately 360°.

10. The invention according to claim 9 wherein said rotation means is coupled to said horizontal axial position and said horizontal planar position axially rotatable magnetic field sensing coil arrangement through a high thermal conductive insulating rod.

11. The invention according to claim 10 wherein said high thermal conductive insulating rod is a sapphire rod.

* * * * *